United States Patent
Hamamura et al.

(10) Patent No.: US 7,682,990 B2
(45) Date of Patent: Mar. 23, 2010

(54) METHOD OF MANUFACTURING NONVOLATILE SEMICONDUCTOR MEMORY DEVICE

(75) Inventors: Hirotaka Hamamura, Kodaira (JP); Toshiyuki Mine, Fussa (JP); Natsuki Yokoyama, Mitaka (JP)

(73) Assignee: Renesas Technology Corp., Tokyo (JP)

( * ) Notice: Subject to any disclaimer, the term of this patent is extended or adjusted under 35 U.S.C. 154(b) by 493 days.

(21) Appl. No.: 11/144,593

(22) Filed: Jun. 6, 2005

(65) Prior Publication Data

US 2005/0272198 A1    Dec. 8, 2005

(30) Foreign Application Priority Data

Jun. 7, 2004    (JP)    ............................. 2004-168325

(51) Int. Cl.
*H01L 21/31* (2006.01)
*H01L 21/469* (2006.01)

(52) U.S. Cl. ............... 438/787; 438/763; 257/E21.267; 257/E21.279; 257/E21.284

(58) Field of Classification Search ................ 438/257, 438/787, 778, 758, 761–763, 769, 770, 786, 438/FOR. 395, FOR. 398, FOR. 399; 257/E21.282–E21.284, E21.279, E21.267
See application file for complete search history.

(56) References Cited

U.S. PATENT DOCUMENTS

| | | | | |
|---|---|---|---|---|
| 2,872,397 A | * | 2/1959 | Kiffer | 204/176 |
| 5,397,748 A | * | 3/1995 | Watanabe et al. | 438/762 |
| 5,412,246 A | * | 5/1995 | Dobuzinsky et al. | 257/632 |
| 5,672,539 A | * | 9/1997 | Thakur et al. | 438/443 |
| 5,966,595 A | * | 10/1999 | Thakur et al. | 438/151 |
| 6,531,350 B2 | * | 3/2003 | Satoh et al. | 438/197 |
| 2004/0040582 A1 | * | 3/2004 | Kikuchi et al. | 134/19 |

FOREIGN PATENT DOCUMENTS

| | | |
|---|---|---|
| JP | 04-320378 | 4/1991 |
| JP | 05-152288 | 11/1991 |
| JP | 2001-274154 | 5/2000 |
| JP | 2003-031705 | 7/2001 |
| JP | 2002-289715 | 2/2002 |
| JP | 2003-318290 | 4/2002 |
| JP | 2004-095918 | 8/2002 |
| JP | 2004-111749 | 9/2002 |

OTHER PUBLICATIONS

Sullivan, Neal, et al., "Exploring ISSG Process Space", 9th International conference on Advanced Thermal Processing of Semiconductors-RTP, Aug. 23, 2001, pp. 95-110.
Office Action from Japanese Patent Office mailed Sep. 8, 2009.

* cited by examiner

*Primary Examiner*—Matthew Smith
*Assistant Examiner*—Quovaunda Jefferson
(74) *Attorney, Agent, or Firm*—Stites & Harbison PLLC; Juan Carlos A. Marquez, Esq.

(57) ABSTRACT

Conventionally, a MONOS type nonvolatile memory is fabricated by subjecting a silicon nitride film to ISSG oxidation to form a top silicon oxide film of ONO structure. If the ISSG oxidation conditions are severe, repeats of programming/erase operation cause increase of interface state density (Dit) and electron trap density. This does not provide a sufficient value of the on current, posing a problem in that the deterioration of charge trapping properties cannot be suppressed.

For the solution to the problem, the silicon nitride film is oxidized by means of a high concentration ozone gas to form the top silicon oxide film.

13 Claims, 4 Drawing Sheets

METHOD OF MANUFACTURING NONVOLATILE SEMICONDUCTOR MEMORY DEVICE

CLAIM OF PRIORITY

The present application claims priority from Japanese application JP 2004-168325, filed on Jun. 7, 2004, the content of which is hereby incorporated by reference into this application.

BACKGROUND OF THE INVENTION

1. Field of the Invention

The present invention relates in general to nonvolatile semiconductor storage devices (nonvolatile memories) capable of electrical programming and erase operation and methods of manufacturing the same. More in particular, it relates to a nonvolatile semiconductor storage device having a stacked structure of a silicon oxide film and a silicon nitride film and a method of manufacturing the same.

2. Description of the Related Art

The nonvolatile semiconductor memory devices (nonvolatile memories) having a stacked structure possessing a silicon oxide film on top of a silicon nitride film can roughly classified into two systems: one is a system that uses a non-conductive charge trap film; and the other is a floating gate system that involves accumulating charge in electrically-isolated conductive polycrystalline silicon.

Figure 4:
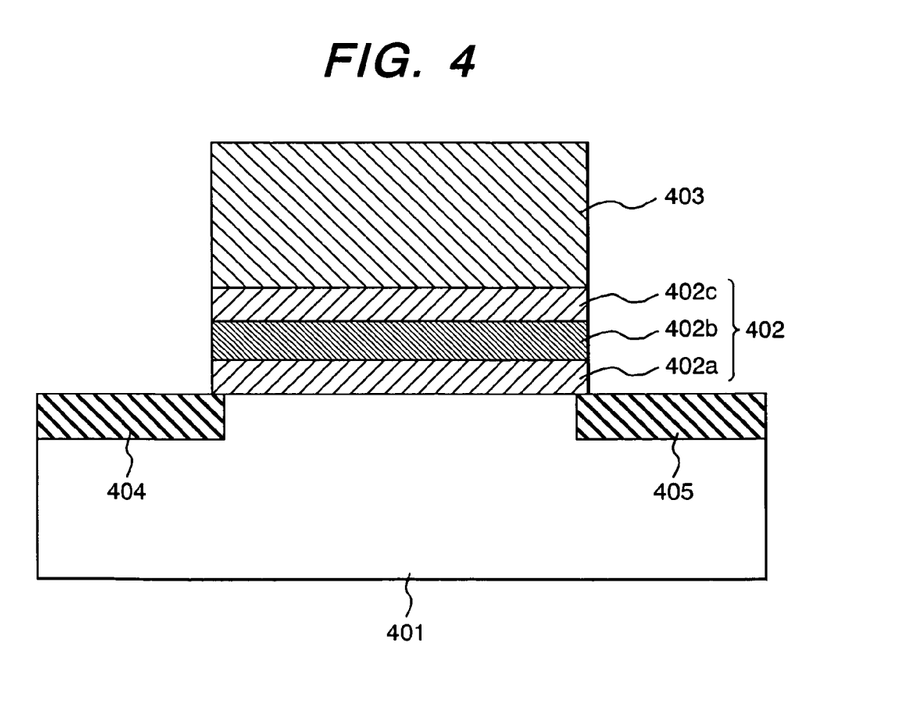
FIG. 4 is a cross-sectional view of a nonvolatile memory cell to which an embodiment of the present invention is applied.

First of all, a nonvolatile memory cell structure using a non-conductive charge trap film will be set forth with reference to FIG. 4. There are formed a semiconductor substrate 401 having a source region 404 and a drain region 405 formed by ion implantation and an insulating film 402 on the channel between these source and drain regions; furthermore a gate electrode 403 made of poly silicon is formed on the insulating film 402. The insulating film 402 is comprised of, in order from the substrate, a bottom silicon oxide film 402a, a silicon nitride film 402b, and a top silicon oxide film 402c. Conventionally, the nonvolatile memory of this type is the Metal-Nitride-Oxide-Silicon (MNOS) type without formation of the top silicon oxide film 402c. Representative examples of products using this structure include IC cards. Programming operation in an MNOS type nonvolatile memory is carried out by applying an appropriate positive voltage to the gate electrode 403 and injected electrons from the channel into the silicon nitride film 402b by direct tunneling through the bottom silicon oxide. At this time, the bottom silicon oxide film 402a has a film thickness of about 2 nm so as to allow direct tunnel phenomena to occur. The erase operation is performed by applying a suitable negative voltage to the gate electrode 403 to extract the electrons injected in the silicon nitride film 402b into the side of the substrate 401 directly through direct tunneling phenomena.

In this MNOS type nonvolatile memory, subjecting the surface of the silicon nitride film 402b to dry oxidation or ozone oxidation makes it possible to form an oxide film of as thin as about 2 nm (402c). As a result, the suppression of a leak current flowing from the SiN holding charge to the gate electrode 403 can improve charge trapping attributes, which is disclosed in Japanese Patent No. 3028635. This patent teaches that the dry oxidation method, however, requires heat treatment at a high temperature (900 to 1200° C.), so ozone oxidation is preferable that enables oxidation at a low temperature of about 350° C.

There have recently emerged growing needs for not only applications (IC cards, etc) in which environmental use temperatures are relatively low (100° C. and less), but nonvolatile memories that can have charge trapping attributes at high temperatures (e.g., 150° C.) and high operation speeds (e.g., on-board applications). An oxide film having a thickness of as thick as 4 nm or more placed on the SiN is essential for meeting these needs. As such, attention has been paid to, instead of the conventional MNOS type, the Metal-Oxide-Nitride-Oxide-Silicon (MONOS) type having a thick oxide film (4 nm or more) placed on the SiN. The MONOS has a structure having a silicon oxide film on a silicon nitride film. Thus, the operation mode is quite different from the above MNOS type. For increased speed, programming is carried out that involves, for example, applying 0 V to the source region 404 and applying appropriate positive voltages to the drain region 405 and the gate electrode 403 to have the transistor switched on, and then accumulating hot electrons generated proximate the drain region 405 in the above silicon nitride film 402b. Read is performed that involves detecting a value of drain current flowing into the source region 404 and the drain region 405. In addition, the erase operation is carried out that involves applying an appropriate positive voltage to any of the substrate 401, the source region 404 and the drain region 405, and extracting the electrons accumulated in the above silicon nitride film 402b by use of the Fowler Nordheim (FN) tunnel phenomena. Alternatively, the erase operation is carried out that involves applying 0 V to the drain region 405 and applying an appropriate positive voltage to the source region 404, applying an appropriate negative charge to the gate electrode 403, and applying a high electric field to between the source region 404 and the gate electrode 403 to generate hot holes from the source region 404, and then implanting the holes into the above silicon nitride film 402b. In this MONOS type, the thicknesses of the bottom silicon oxide film 402a and the top silicon oxide film 402c are from about 4 to about 6 nm.

In the step of forming the above stacked ONO structure, the formation of the top silicon oxide film 402c has utilize, for example, a wet (external combustion type) oxidation method of the batch system. The method, however, has been shown unsuitable as a fine (e.g., a node of 90 nm or less) semiconductor device forming means, because of high-temperature, long-time processing resulting in a large thermal budget. Accordingly, single wafer type In-Situ-Steam-Generation (ISSG) oxidation (internal combustion pyrogenic oxidation) has gone mainstream that is capable of forming a thick oxide film in a short time and meets a larger aperture of the wafer. ISSG oxidation features the formation of radical oxygen immediately above the wafer. This enables the formation of a thick oxidation film at a high temperature in a short time. Well-known examples thereof include a disclosure of Japanese Patent Laid-open No. 2002-289715.

Figure 2:
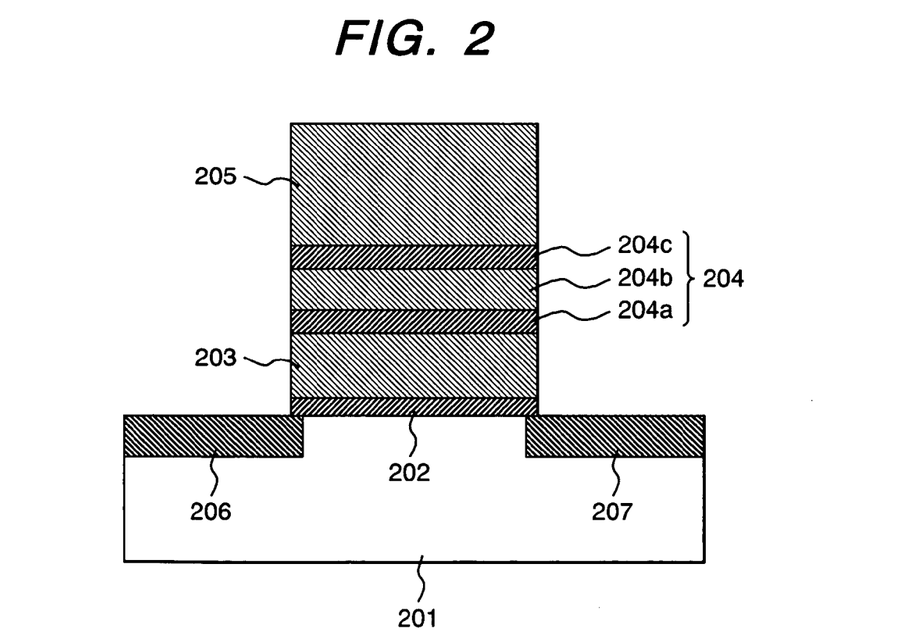
FIG. 2 is a cross-sectional view of a nonvolatile memory cell to which an embodiment of the present invention is applied.

Next, the structure of a floating gate type nonvolatile memory cell will be described. As shown in FIG. 2, the method of fabricating the conventional floating gate type involves forming a semiconductor substrate 201 having a source region 206 and a drain region 207 formed by ion implantation, and a tunneling silicon oxide film 202 on the channel between these source-drain regions. The method further involves forming a floating gate electrode 203 comprised of poly-silicon thereon, forming an interlayer insulating film 204, and subsequently forming a control gate electrode 205 comprised of poly-silicon. The interlayer insulating film 204 includes a silicon oxide film (O) 204a, a silicon nitride film (N) 204b and a silicon oxide film (O) 204c, i.e., an ONO stacked structure, in order from the substrate. The programming of data in this flowing gate type nonvolatile memory cell involves applying, for example, 0 V to the source region 206, applying an appropriate positive voltage to the drain region 207, and further applying an appropriate positive voltage to the control gate electrode 205 to implant the hot electrons generated in the channel into the flowing gate electrode 203. Read is carried out by detecting a value of drain current that passes through the source region and drain region. The erase operation involves applying an appropriate negative voltage to the control gate electrode 205 and applying an appropriate positive voltage to the substrate 201, and then extracting electrons accumulated in the floating gate electrode 203 into the substrate 201 by use of FN tunnel phenomena. In the step of forming the above interlayer insulating film, the formation of the upper layer silicon oxide film 204c conventionally makes use of low pressure CVD, wet oxidation, and the like. A film fabricated by CVD, however, poses the problem of the presence of many electron traps. Wet oxidation requires heat treatment for a long period of time at a high temperature. This apparently presents the problem of forcing a large thermal budget. In addition, Japanese Patent Laid-open No. 5-152288 discloses the degradation of film quality by wet oxidation. The patent describes dry oxidation and ozone oxidation as means without degradation. It also discloses the use of ozone oxidation, which makes it possible to form a relatively thick (2.6 nm) oxide film as compared with the case of dry oxidation (1.1 nm), thereby well suppressing the interlayer leak current.

SUMMARY OF THE INVENTION

Conventional problems will be discussed in the respective cases of the nonvolatile memories (MNOS, MONOS types) using nonconductive charge trap films and the floating gate type nonvolatile memory in the section of the above related art.

First, for the use of ozone for the formation of a silicon oxide film on the silicon nitride film, the thickness of the silicon oxide film formed is 3 nm or less. In the MNOS and MONOS type nonvolatile memories, charges accumulated in the silicon nitride film 402b are easy to move to the side of the gate electrode 403 via tunnel phenomena for an oxide film with a thickness of about 3 nm. This poses the problem of an insufficient improvement in charge trapping properties. Because of the same reason also, there is a problem in that the suppression of the leak current of the interlayer between the control gate electrode 205 and the flowing gate electrode 203 is insufficient even in the floating gate type nonvolatile memory.

In general, ozone is formed by exposure of oxygen to ultraviolet irradiation or plasma discharge. These approaches can principally produce only ozone having a maximum concentration of 20%. In a chamber or the like of actual processing, ozone of less than 20% can only be supplied naturally. At an ozone concentration of less than 20%, the formation of an oxide film of 3 nm or more is conventionally impossible within the range of the mass-producible throughput. (The cause of this will be described in detail below.) Due to the above reasons, the above problems are presented.

Figure 3:
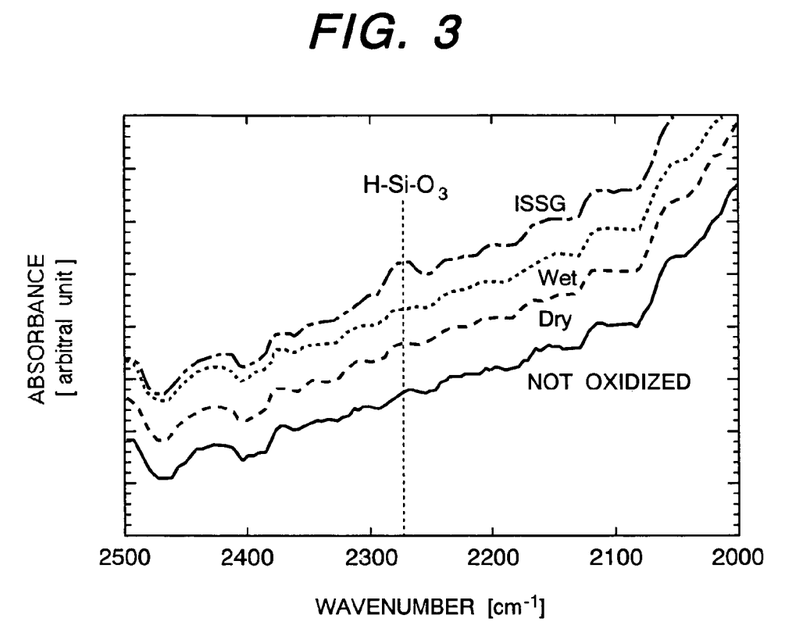
FIG. 3 shows infrared absorption spectra of samples in which those silicon nitride films are subjected to no processing, dry oxidation, wet oxidation and ISSG oxidation, respectively.

On the other hand, our studies show the following. A silicon nitride film can sufficiently be oxidized if the ISSG oxidation method is employed that features the formation of radical oxygen immediately above the wafer. The improvement of charge trapping properties and the suppression of leak current are sufficiently possible because the resulting silicon oxide film has a thickness of as thick as 4 nm or more. However, the bottom oxide film 402a and the tunneling silicon oxide film 202 are deteriorated that are formed prior to the formation of the silicon nitride film. More specifically, a portion of Si—O bonds in the silicon oxide film is converted into Si—H bonds (FIG. 3). This clearly leads to increases in electron trap density and interface state density (Dit).

Now, the principle of ISSG oxidation is explained in detail. ISSG admixes hydrogen with oxygen immediately above the silicon wafer and causes the following reaction.

$H_2 + O_2 \rightarrow O^* + OH + H$

The main product of this reaction is the oxygen radical O*, but unreacted hydrogen also is partially present ((Advanced Thermal Processing of Semiconductor 9th International Conference on RTP 2001), 2001, pp. 95-110). It is known that the enhancement of the oxidation speed requires the severe conditions of (1) a high temperature and (2) a high hydrogen partial pressure. The fabrication of a silicon oxide film of 4 nm or more via oxidation of a silicon nitride film must make use of either of (1) or (2) or the combination of the conditions. The Si—H bond peaks observed in FIG. 3 above attribute to those of products generated when unreacted hydrogen is dispersed in or reacts with the silicon oxide film under these severe ISSG conditions.

Interface state density (Dit) increases with programming/erase operation times when the oxidation conditions of ISSG are severe in an MONOS type nonvolatile memory, so that the ON current Id cannot be taken at the same memory gate voltage, thereby restricting the number of programming/erase operation. Moreover, there is a problem in that a large number of electron trap sites are produced in the oxide film; the sites deteriorate charge trapping properties.

In addition, the above nonvolatile memory itself not only is used as a single memory, but also is loaded together with a logic transistor. Fabrication of a nonvolatile memory portion subsequent to the logic transistor fabrication poses a problem in that the gate insulating film of the peripheral logic transistors is deteriorated. This is because when ISSG oxidation is applied to a nonvolatile memory, heat treatment at a high temperature as noted above is carried out in the presence of hydrogen.

An object of the present invention is to improve the attributes of a nonvolatile memory of a structure having a silicon oxide film on top of a silicon nitride film. In particular, the invention is directed to the improvement of programming/erase endurance and the prevention of deterioration of charge trapping properties without degrading the interfacial properties of a gate insulating film prior to formation of the silicon nitride film.

Figure 8:
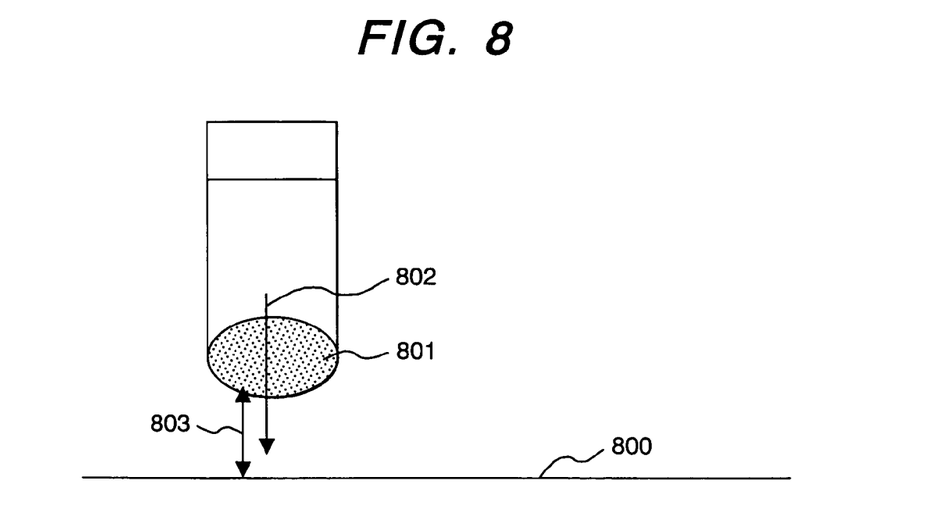
FIG. 8 is a diagram indicating the relationship between an ozone gas flow rate and its flow speed.

The most important feature of the present invention is to oxidize a silicon nitride film in an oxidizing atmosphere without hydrogen and to fabricate a silicon oxide film of 4 nm or more on top of the silicon nitride film. This is for the purpose of decreasing the interface state density of the gate oxide film formed prior to the silicon nitride film and suppressing the generation of electron trap sites in the oxide film. Specifically, the silicon oxide film is fabricated by an oxidation method using ozone of a high concentration. The silicon oxide film is formed under the process conditions satisfying $L/U < 2 \times 10^{-3}$ [s], for instance, where the distance 803 between the ozone inlet and the wafer is set to L [m], and the ozone gas flow rate 802 is set to U [m/s]. Furthermore, with satisfying these conditions, a silicon oxide film of 4 nm or more is desirably formed under conditions of an ozone concentration of 20% or more and an ozone partial pressure of from 133 Pa to 20 kPa.

Use of the present invention enables the suppression of increases in the interface state density and the electron trap density of a transistor, thus greatly improving the reliability of the nonvolatile memory. In particular, the programming/erase endurance and charge trapping properties are improved.

Additionally, the invention does not worsen the reliability of a gate oxide film fabricated prior to the formation of the silicon nitride film, whereby good device attributes are obtainable even when either the nonvolatile memory section or the peripheral logic section is initially formed.

With the combination of the above effects, the present invention can yield a nonvolatile memory excellent in programming/erase endurance and charge trapping properties.

DESCRIPTION OF THE PREFERRED EMBODIMENTS

The present invention will be set forth in detail in terms of preferred embodiments hereinafter.

Embodiment 1

Figure 1:
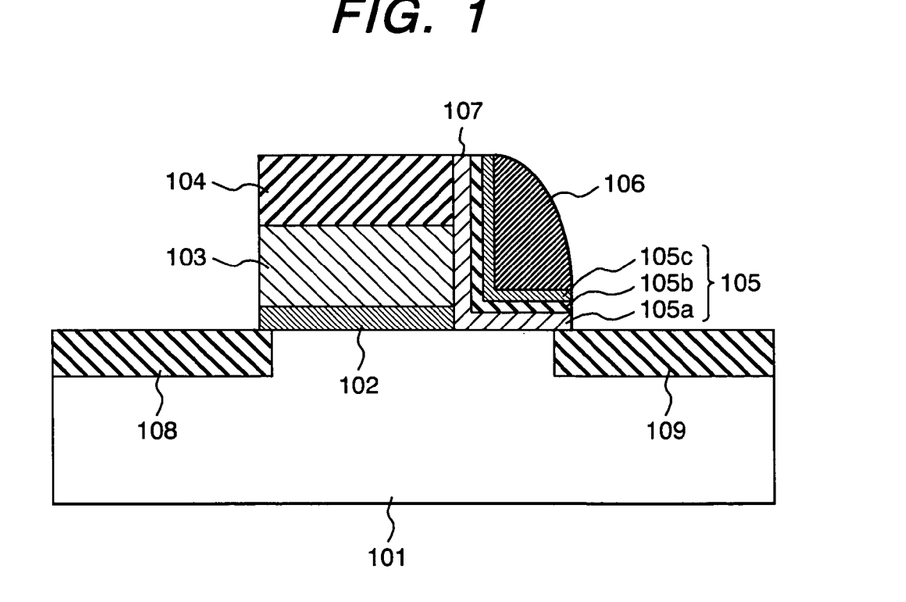
FIG. 1 is a cross-sectional view of a nonvolatile memory cell to which an embodiment of the present invention is applied.

A first embodiment of the present invention will be described. This embodiment relates to a method of production that uses a high concentrated ozone for forming a silicon oxide film on top of the silicon oxide film, in a MONOS memory having a split gate construct utilizing self-alignment. FIG. 1 is a cross-sectional view of a nonvolatile memory cell according to a first embodiment of the present invention. Actually, in the upper part of the figure is present wiring, but it is omitted in this figure. The memory cell comprises two MOS transistors, including a p type well region 101 provided on a silicon substrate, an n type diffusion layer to be a source region 108, and an n type diffusion layer to be a drain region 109. The selective MOS transistor includes a silicon oxide film to be a gate insulating film 102, an n type poly-crystal Si film to be a selective gate electrode 103, and an insulating film 104 formed on top of the gate electrode. The memory MOS transistor has an insulating film 105 formed on top of the channel between the source 108 and the drain 109. This insulating film 105 includes, in order from the channel side, a bottom silicon oxide film 105a (O), a silicon nitride film (N) to be a charge film 105b, a top silicon oxide film 105c (O), and an n type poly-crystal silicon film to be a memory gate electrode 106. As shown in this figure, the memory MOS transistor is formed in a self-aligning technique relative to the selective MOS transistor.

The manufacturing method of the present embodiment will be described in detail with reference to the drawing hereinafter. First, on the silicon substrate 101, a groove type device separation region (not shown) is formed using a well-known technique. Next, a silicon oxide film of 2.8 nm to be the gate insulating film 102 of the selective MOS transistor is formed by dry oxidation at 850° C. In this case, it may be formed by wet oxidation. Also, a nitrided silicon oxide film can be used in place of the silicon oxide film; the nitrided silicon oxide film is formed by heat treatment in a nitriding atmosphere such as a nitrogen monoxide (NO) or nitrous oxide ($N_2O$) atmosphere. For instance, nitrogen of 3% is introduced into the interface between the Si substrate 101 and the gate insulating film by heat treatment at 900° C. for 10 minutes in an NO atmosphere where the NO concentration is diluted to 10% by $N_2$, thereby improving the reliability of the gate insulating film 102.

Next, a phosphorus doped poly-crystal silicon film to be the selective gate electrode 103 is deposited to a thickness of 150 nm by CVD, and then a cap oxide film 104 to be a mask during processing is deposited to a thickness of 50 nm by CVD. The phosphorus density of the above phosphorus doped poly-crystal silicon film 103 is set to $3\times10^{20}$ atms/cm$^3$. After patterned by the well-known lithography step, the cap oxide film 104 followed by the phosphorus doped poly-crystal silicon 103 is processed using a photoresist as a mask to a specified shape by dry etching. Then, the gate insulating film 102 excluding the above poly-crystal silicon 103 is removed with an aqueous diluted HF solution. After the surface of the silicon substrate 101 is exposed, a bottom silicon oxide film 105a of 5 nm is formed at 850° C. by dry oxidation. The bottom silicon oxide film also may be formed by wet oxidation, ISSG oxidation, ozone oxidation, or plasma oxidation. In this case, a sidewall of the selective gate electrode 103 was oxidized at the same time to form a sidewall silicon oxide film 107. Instead of the bottom silicon oxide film, a nitrided silicon oxide film can also be used that is heat treated in a nitriding atmosphere such as a nitrogen monoxide (NO) or nitrous oxide ($N_2O$) atmosphere. For instance, nitrogen of 3% is introduced into the interface between the Si substrate 101 and the bottom silicon oxide film by heat treatment at 900° C. for 10 minutes in an NO atmosphere where the NO concentration is diluted to 10 percent by $N_2$, thereby improving the reliability of the bottom silicon oxide film 105a.

Next, a silicon nitride film to be a charge trapping film 105b is formed to a thickness of about 10 to about 14 nm at 780° C. at a total pressure of 60 Pa by means of low-pressure CVD using dichlorosilane ($SiH_2Cl_2$) and ammonia ($NH_3$) as precursors. In addition, the silicon nitride film 105b may be formed by means of CVD using silane ($SiH_4$) and ammonia ($NH_3$) as precursors. Moreover, the silicon nitride film 105b may be formed by means of CVD using disilane ($Si_2H_6$) and ammonia ($NH_3$) as precursors. A silicon oxide film 105c formed on top of the silicon nitride film 105b is formed by conversion of a portion of the silicon nitride film 105b into a silicon oxide film via oxidation with high concentrated ozone. Subsequent to this ozone oxidation, the silicon nitride film 105b is formed to a thickness of 8 to 0.12 nm and a silicon oxide film 105c is formed to a thickness of 4 to 6 nm on top thereof. A memory gate electrode 106 is fabricated by forming a phosphorus doped poly-crystal silicon film containing $5\times10^{20}$ atms/cm$^3$ phosphorus to a thickness of 90 nm by low-pressure CVD and then leaving the phosphorus doped poly-crystal silicon film only on the side wall portion of the pattern step using a self-aligning method by anisotropic dry etching. The channel length of the memory MOS transistor was determined by the thickness of this phosphorus doped poly-crystal silicon film, with the length being 90 nm in the embodiment. Next, the top silicon oxide film 105c, the silicon nitride film 105b and the bottom silicon oxide film 105a, which have been exposed by anisotropic dry etching, are etched in the order. Thereafter, post oxidation is carried out by ISSG to a thickness of about 4 nm in order to recover the damage of the sidewall shape due to dry etching. Next, arsenic was implanted at a density of $2\times10^{15}$ atoms/cm$^2$ through ion implantation, and then heat treatment is performed at 1000° C. for 10 seconds to fabricate the source 108 and the drain 109. Then, all the steps of the example of the present invention are completed using a well-known technique through a wiring step.

Figure 6:
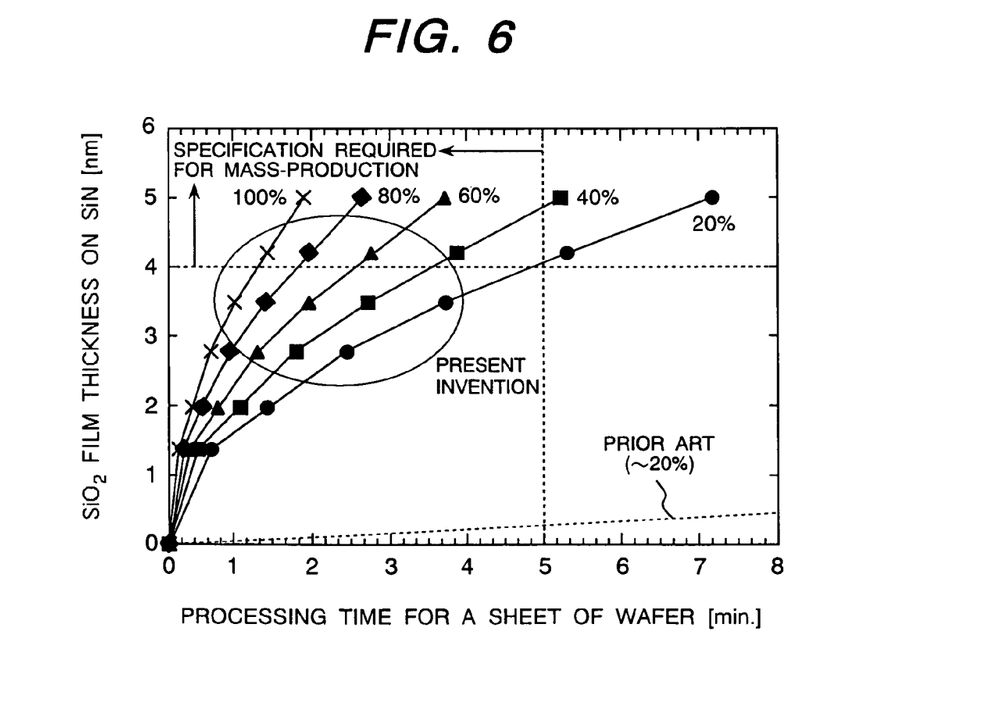
FIG. 6 is a diagram indicating a comparison of an example of the present invention with a conventional example.

Now, the ozone oxidation process as noted above is described in detail. The process temperature of the ozone oxidation is 850° C., the ozone concentration is 80%, and the partial pressure is 1.33 kPa. The ozone concentration in this case is the fraction of ozone relative to the entire gas; the gases excluding ozone are ones containing no hydrogen. Examples of the gases include oxygen and nitrogen, and more preferably may include noble gases, such as argon, which do not react with ozone. The gases except ozone may be used in combination. The absolute values of the oxidation temperature, ozone concentration and partial pressure are an example; the ozone oxidation process can be carried out under various conditions depending on the time allowable for silicon oxide film formation, the film quality of the silicon nitride film and a desired silicon oxide film thickness. FIG. 6 shows as an example the effect of the ozone concentration on the processing time per sheet of wafer at 850° C. at a processing pressure of 1.33 kPa. The abscissa indicates the processing time for a sheet of wafer and the ordinate indicates the SiO$_2$ film thickness on top of the SiN. Results from conventional ozone oxidation are shown in the same graph. If mass-production application is taken into account, the processing time per sheet of wafer is desirably within 5 minutes. In addition, the SiO$_2$ film thickness on the SiN is needed to be 4 nm or more.

The difference between the conventional example and the embodiment of the present invention will be set forth in detail. It is generally known that ozone is relatively stable at room temperature, but easily decomposes at high temperature to return to oxygen. In the conventional ozone oxidation, however, the effect of the ozone concentration decrease due to thermal decomposition of the ozone is not quantitatively considered. Factors that greatly affect the effect, such as a gas flow rate, pressure and the introduction method, have never been studied in detail. As such, as indicated in the conventional example in FIG. 6, satisfying the mass-production specifications was not made at all even using ozone of a concentration of about 20%. Hence, the present invention makes an attempt to shorten the arrival time of the ozone from the ozone inlet until the wafer as compared with the thermal decomposition time, in order to prevent thermal decomposition of the ozone as much as possible. This has enabled a sufficient satisfaction of the specifications needed for mass-production (refer to FIG. 6).

Figure 7:
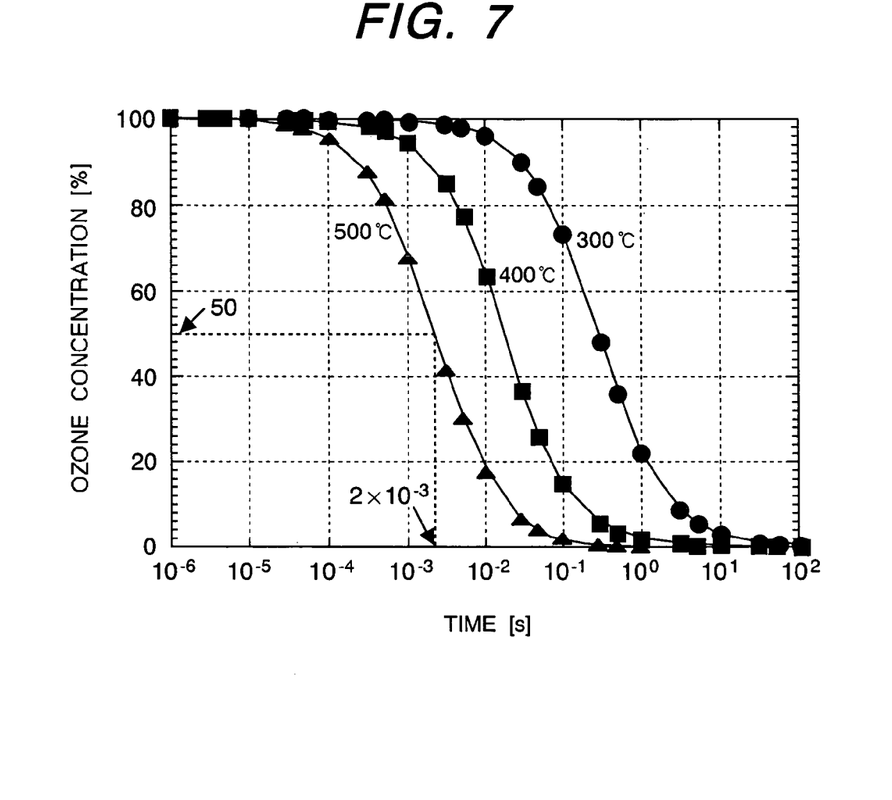
FIG. 7 is a diagram indicating the relationships between the ratios of thermal decomposition of ozone gas samples and time.

Now, the thermal decomposition time of ozone and the arrival time of ozone gas to a wafer are described in detail and the feature of the SiO$_2$ film formation of the present invention is discussed. FIG. 7 shows the relationship between ozone concentration and time that we estimated based on the disclosed decomposition constant ("Fundamentals and Applications of Ozone" by Sugimitsu, (ISBN: 4-7712-9601-4), pp. 58-87). Where the wafer temperature is 850° C., the ozone gas temperature just above the wafer is thought to take a value between room temperature and 850° C. Now, assuming that ozone gas temperature is about 500° C., the thermal decomposition time of ozone is $2\times10^{-3}$ sec. (The time when the initial ozone concentration becomes a half is defined as the thermal decomposition time of ozone.) In other words, the time the ozone gas takes to reach the wafer must be shorter than $2\times10^{-3}$ sec. If the distance from an ozone inlet to the wafer is defined as L [m], and the flow rate of the ozone gas is defined as U [m/s], the time t the ozone gas takes to reach the wafer can be represented by L/U. L is a value that can be determined depending on apparatus construction. If commonly considered, it is estimated, considering a warp of the wafer, that the minimum distance value is about 1 mm and the maximum distance value is about 10 cm. Now, L is assumed to be 2 cm and the ozone gas flow rate required is tried to be estimated. The flow rate needs to be 10 [m/s] or more, in order for the decomposition time t to be $2\times10^{-3}$ sec or less. Additionally, the flow rate U can be defined as the following equation:

$$U=(A/S)\times1.01\times10^5/P\times(T/273)$$

where A is the flow rate [m$^3$/s] in standard states (1 atm, 0° C.), S is the area of the gas inlet [m$^2$], P is the gas pressure [Pa], and T is the ozone gas temperature [K] (refer to FIG. 8). When S is $3\times10^{-6}$ [m$^2$] (when a cylindrical inlet having a diameter of 2 mm is used), the ozone gas pressure is $1.33\times10^3$ [Pa], and the ozone gas temperature is 500 [° C.], the ozone gas flow rate must be $1.4\times10^{-6}$ [m$^3$/s] or more, from the previous equation.

The calculation example illustrated here is only an embodiment of the present invention. Needless to say, use of a combination of process conditions meeting L/U<$2\times10^{-3}$ can attain the specifications required for mass-production as indicated in FIG. 6. In addition, the ozone concentration is more desirably 20% or more in order to achieve the specifications needed for mass-production.

Our various studies have shown that the ozone partial pressure is desirably from 133 Pa to 20 kPa. However, when the ozone partial pressure exceeded 1.33 kPa, rapid decomposition of the ozone on initiation of lamp overheating rapidly varied the pressure within the chamber. As a result, many foreign materials were observed on the wafer surface. According, an ozone partial pressure not exceeding 1.33 kPa is desirable from the standpoint of improving the yield. That is, the oxidation is desirably carried out under conditions of an ozone concentration of 20% or more and an ozone partial pressure of from 133 Pa to 1.33 kPa.

Furthermore, process apparatus used in the above ozone oxidation processing is desirably a lamp type rapid thermal annealing (RTA) apparatus capable of rapid cooling and rapid heating in order to efficiently make use of the effects of high concentration ozone. The use of an apparatus of this type rapidly heats and decomposes the ozone proximate to the wafer surface, making the oxidation efficiency good. The method of introducing ozone gas into the surface of a wafer is desirably an extrusion method from a lateral direction or a method of spraying ozone gas on a wafer. In either case, the larger the flow rate of ozone gas, or the higher the ozone gas partial pressure, or the higher the ozone concentration, the higher the oxidation speed. In particular, when a method of spraying ozone on a wafer is used, the oxidation speed is increased as the distance between the wafer and the spraying portion is shortened. In this embodiment, the oxidation speed increase is confirmed by setting the distance to 20 mm and 5 mm. Additionally, a tube of a material that does not absorb the lamp light is desirably used in the ozone gas inlet structure within a RTA chamber. Consequently, the tube for introducing ozone gas is not heated with lamp light. This makes it possible to suppress thermal decomposition of the ozone gas flowing through the inside of the tube. The present embodiment uses a tungsten/halogen lamp and a quartz tube for ozone gas introduction within the chamber. In addition, in this embodiment, ozone of a high concentration of 20% or more is prepared as below. A mixture gas of ozone of about 10% and oxygen is prepared by means of a general ozonizer, and then the resulting mixture is cooled. Subsequently, the oxygen alone is evacuated by making use of differences between oxygen and ozone in vapor pressure and adsorption property, thereby increasing the ozone concentration.

In addition, needless to say, use of the conventional oxidation furnace also can find the effectiveness of ozone oxidation although the efficiency is decreased.

Next, the operation of this nonvolatile memory is explained. First, programming of data is carried out by hot electron, which is injected from source side. For instance, the voltage Vs applied to the source region 108 is 5 V; the voltage Vd applied to the drain region 109 is 0 V; the voltage Vmg applied to the gate electrode 106 of a memory MOS transistor is 12 V; the voltage Vsg applied to the gate electrode 103 of a selective MOS transistor is almost the same as the threshold voltage Vth of the transistor. The region of generating hot electrons is the channel section below the region where the gates 103 and 106 of the two transistors are insulated from each other. Programming is set in such a way that the threshold value of the memory transistor is about 5 V.

Erase operation is carried out by hot hole injection using band-to-band tunneling. The voltage Vmg applied to the gate electrode 106 of the memory MOS transistor is −6 V; the voltage Vd applied to the drain region 109 is from 5 to 7 V; the other voltages are set to 0 V and erase operation is performed until the threshold value of the transistor is −1 V. In addition, the voltage conditions of the programming and erase described in this instance are illustrative; the numerical values do not limit the present invention.

Electric properties of the MONOS nonvolatile memory having a split gate structure fabricated in this embodiment was compared with those of a memory by ISSG oxidation of the conventional art. As a result, the read current and programming time were equivalent to the values of the conventional memory. The increase of the interface state density (Dit) by repetition of programming/erase of a sample was suppressed as compared with the case where a silicon oxide film was formed on top of the silicon nitride film via ISSG oxidation. Moreover, an increase in the trap density was suppressed. This led to the yield of a programming/erase endurance value of $1\times10^5$ times. The comparative evaluation of charge trapping properties at 150° C. after a programming/erase operation of $1\times10^4$ times revealed that the properties were improved by an order of magnitude relative to those of the conventional case by ISSG oxidation.

In this embodiment, ozone of a high concentration is applied to the formation of the silicon oxide film on the silicon nitride film. However, even if high concentration ozone is applied to post oxidization subsequent to the aforementioned dry etching, increases in interface state density and trap density are suppressed as compared with the case of using ISSG oxidation.

Figure 5:
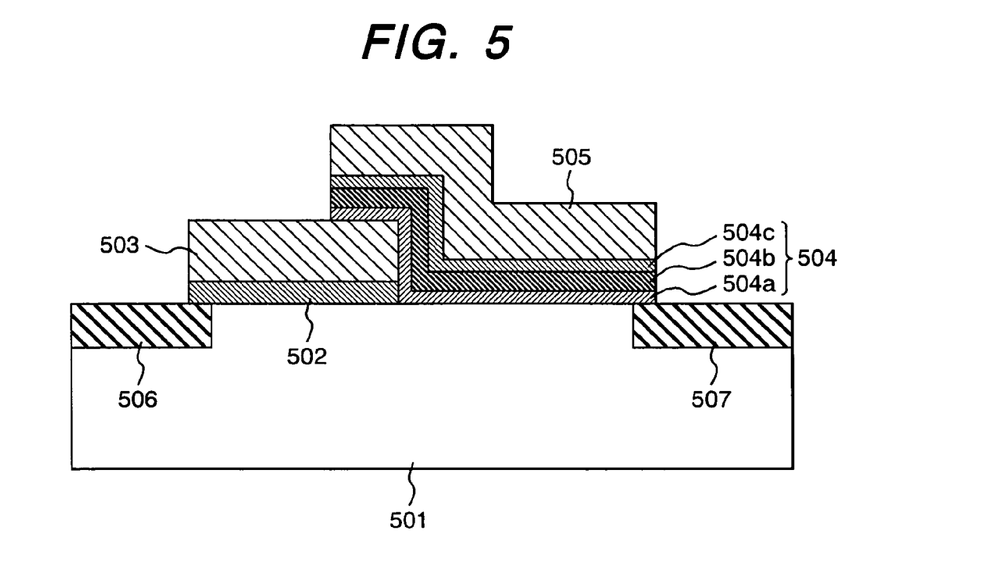
FIG. 5 is a cross-sectional view of a nonvolatile memory cell to which an embodiment of the present invention is applied.

Additionally, in this embodiment, the memory MOS type transistor was formed by means of the self-aligning method after the selective MOS type transistor is fabricated. Consequently, it is confirmed that similar results are obtained in the structure in which a memory MOS type transistor is mounted after a selective MOS transistor was formed, as shown in FIG. 5, as well as in the MONOS nonvolatile memory of a single gate structure as illustrated in FIG. 4.

This nonvolatile memory cell and a logic semiconductor device can also be consolidated on the same silicon substrate. In this case, even if the nonvolatile memory cell is fabricated subsequent to the formation of the logic semiconductor device, the deterioration of the gate insulating film of the logic semiconductor due to electrical stress is suppressed as compared with the case where conventional ISSG oxidation is applied to a nonvolatile memory cell.

Embodiment 2

Next, a second embodiment of the present invention will be set forth with reference to FIG. 2. This embodiment relates to a method of production that uses high-concentration ozone oxidation in forming a silicon oxide film on top of a silicon nitride film, in a floating gate type nonvolatile memory.

FIG. 2 is a cross-sectional view of a nonvolatile memory cell according to a second embodiment of the present invention. Actually, wiring is present in the upper part of the drawing, but is omitted in this figure. The memory cell includes a semiconductor substrate having a source region 206 and a drain region 207 that are formed by ion implantation and a tunneling silicon oxide film 202 formed on the channel between the source-drain regions. A floating gate electrode 203 comprised of poly-silicon is formed thereon. After formation of an interlayer insulating film 204 thereon, a control gate electrode 205 comprised of poly-silicon is formed thereon. The interlayer insulating film 204 includes a silicon oxide film (O) 204a, a silicon nitride film (N) 204b and a silicon oxide film (O) 204c, i.e., an ONO stacked structure, in order from the substrate.

The method of production of the present embodiment is described in detail with reference to the drawing hereinafter. First, on the silicon substrate 201, a groove type device separation region (not shown) is formed using a well-known technique. Next, a silicon oxide film of 8.0 nm to be the tunneling silicon oxide film 202 is formed via ISSG oxidation at 900° C. In this case, it may be formed by wet oxidation. Also, in place of the silicon oxide film a nitrided silicon oxide film can be used that is formed by heat treatment in a nitriding atmosphere such as a nitrogen monoxide (NO) or nitrous oxide ($N_2O$) atmosphere. For instance, nitrogen of about 3% is introduced into the interface between the Si substrate 201 and the gate insulating film by heat treatment at 900° C. for 10 minutes in an NO atmosphere, the NO concentration being diluted to 10 percent by $N_2$, thereby improving the reliability of the gate insulating film 202.

Next, a poly-crystal silicon film to be the floating gate electrode 203 was deposited to a thickness of 50 nm by CVD. Thereafter, the interlayer insulating film ONO 204 is formed. First, the silicon oxide film 204a is formed to a thickness of 6 nm by ISSG oxidation at 950° C. In this case, the silicon oxide film may be deposited by CVD using silane ($SiH_4$) and nitrous oxide ($N_2O$). Then, the silicon nitride film 204b is formed to a thickness of about 10 to about 14 nm at 800° C. by means of a low-pressure CVD method using dichlorosilane ($SiH_2Cl_2$) and ammonia ($NH_3$) as precursors. Moreover, the silicon nitride film 204b may be formed by means of CVD using silane ($SiH_4$) and ammonia ($NH_3$) as precursors. In addition, the silicon nitride film 204b may be formed by means of CVD using disilane ($Si_2H_6$) and ammonia ($NH_3$) as precursors. A silicon oxide film 204c formed on top of the silicon nitride film 204b is formed by conversion of a portion of the silicon nitride film 204b into a silicon oxide film via oxidation with high concentrated ozone. Subsequent to this ozone oxidation, the silicon nitride film 204b is formed to a thickness of from 8 to 12 nm and the silicon oxide film 204c is formed to a thickness of from 4 to 6 nm on top thereof. A control gate electrode 205 is fabricated by forming a phosphorus doped poly-crystal silicon film containing $3 \times 10^{20}$ atms/cm$^3$ phosphorus to a thickness of 150 nm by low-pressure CVD. Then, the gate electrode is patterned by the well-known lithography technique. Thereafter, the control electrode 205, the upper layer oxide film 204c, the silicon nitride film 204b and the lower layer silicon oxide film 204a are etched in the order by anisotropic dry etching. Subsequently, post oxidation is carried out by ISSG to a thickness of about 4 nm in order to recover the damage of the sidewall shape due to dry etching.

Next, arsenic is implanted at a density of $2 \times 10^{15}$ atoms/cm$^2$ by ion implantation, and then heat treatment is performed at 1000° C. for 10 seconds to fabricating the source 206 and the drain 207. Then, all the steps of the embodiment of the present invention are completed using a well-known technique through a wiring step.

Now, the ozone oxidation process as noted above is described in detail. The process temperature of the ozone oxidation is 850° C., the ozone concentration is 80%, and the partial pressure is 1.33 kPa. The ozone concentration in this case is the fraction of ozone relative to the entire gas; the gases excluding ozone are ones containing no hydrogen. Examples of the gases include oxygen and nitrogen, and more preferably may include noble gases, such as argon, which do not react with ozone. The gases except ozone may be used in combination. The absolute values of the oxidation temperature, ozone concentration and partial pressure are an example; the ozone oxidation process can be carried out under various conditions depending on the time allowable for silicon oxide film formation, the film quality of the silicon nitride film and a desired silicon oxide film thickness. FIG. 6 shows as an example the effect of the ozone concentration on the processing time per sheet of wafer at 850° C. at a processing pressure of 1.33 kPa. The abscissa indicates the processing time for a sheet of wafer and the ordinate indicates the SiO$_2$ film thickness on top of the SiN. Results from conventional ozone oxidation are shown in the same graph. If mass-production application is taken into account, the processing time per sheet of wafer is desirably within 5 minutes. In addition, the SiO$_2$ film thickness on the SiN is needed to be 4 nm or more.

The difference between the conventional example and the embodiment of the present invention will be set forth in detail. It is generally known that ozone is relatively stable at room temperature, but easily decomposes at high temperature to return to oxygen. In the conventional ozone oxidation, however, the effect of the ozone concentration decrease due to thermal decomposition of the ozone is not quantitatively considered. Factors that greatly affect the effect, such as a gas flow rate, pressure and the introduction method, have never been studied in detail. As such, as indicated in the conventional example in FIG. 6, satisfying the mass-production specifications was not made at all even using ozone of a concentration of about 20%. Hence, the present invention makes an attempt to shorten the arrival time of the ozone from the ozone inlet until the wafer as compared with the thermal decomposition time, in order to prevent thermal decomposition of the ozone as much as possible. This has enabled a sufficient satisfaction of the specifications needed for mass-production (refer to FIG. 6).

Now, the thermal decomposition time of ozone and the arrival time of ozone gas to a wafer are described in detail and the feature of the SiO$_2$ film formation of the present invention is discussed. FIG. 7 shows the relationship between ozone concentration and time that we estimated based on the disclosed decomposition constant ("Fundamentals and Applications of Ozone" by Sugimitsu, (ISBN: 4-7712-9601-4), pp. 58-87). Where the wafer temperature is 850° C., the ozone gas temperature just above the wafer is thought to take a value between room temperature and 850° C. Now, assuming that ozone gas temperature is about 500° C., the thermal decomposition time of ozone is $2 \times 10^{-3}$ sec. (The time when the initial ozone concentration becomes a half is defined as the thermal decomposition time of ozone.) In other words, the time the ozone gas takes to reach the wafer must be shorter than $2 \times 10^{-3}$ sec. If the distance from an ozone inlet to the wafer is defined as L [m], and the flow rate of the ozone gas is defined as U [m/s], the time t the ozone gas takes to reach the wafer can be represented by L/U. L is a value that can be determined depending on apparatus construction. If commonly considered, it is estimated, considering a warp of the wafer, that the minimum distance value is about 1 mm and the maximum distance value is about 10 cm. Now, L is assumed to be 2 cm and the ozone gas flow rate required is tried to be estimated. The flow rate needs to be 10 [m/s] or more, in order for the decomposition time t to be $2 \times 10^{-3}$ sec or less. Additionally, the flow rate U can be defined as the following equation:

$$U = (A/S) \times 1.01 \times 10^5 / P \times (T/273)$$

where A is the flow rate [m$^3$/s] in standard states (1 atm, 0° C.), S is the area of the gas inlet [m$^2$], P is the gas pressure [Pa], and T is the ozone gas temperature [K] (refer to FIG. 8). When S is $3 \times 10^{-6}$ [m$^2$] (when a cylindrical inlet having a diameter of 2 mm is used), the ozone gas pressure is $1.33 \times 10^3$ [Pa], and the ozone gas temperature is 500 [° C.], the ozone gas flow rate must be $1.4 \times 10^{-6}$ [m$^3$/s] or more, from the previous equation.

The calculation example illustrated here is only an embodiment of the present invention. Needless to say, use of a combination of process conditions meeting L/U<$2 \times 10^{-3}$ can attain the specifications required for mass-production as indicated in FIG. 6. In addition, the ozone concentration is more desirably 20% or more in order to achieve the specifications needed for mass-production.

Our various studies have shown that the ozone partial pressure is desirably from 133 Pa to 20 kPa. However, when the ozone partial pressure exceeded 1.33 kPa, rapid decomposition of the ozone on initiation of lamp overheating rapidly varied the pressure within the chamber. As a result, many foreign materials were observed on the wafer surface. According, an ozone partial pressure not exceeding 1.33 kPa is desirable from the standpoint of improving the yield. That is, the oxidation is desirably carried out under conditions of an ozone concentration of 20% or more and an ozone partial pressure of from 133 Pa to 1.33 kPa.

Furthermore, process apparatus used in the above ozone oxidation processing is desirably a lamp type rapid thermal annealing (RTA) apparatus capable of rapid cooling and rapid heating in order to efficiently make use of the effects of high concentration ozone. The use of an apparatus of this type rapidly heats and decomposes the ozone proximate to the wafer surface, making the oxidation efficiency good. The method of introducing ozone gas into the surface of a wafer is desirably an extrusion method from a lateral direction or a method of spraying ozone gas on a wafer. In either case, the larger the flow rate of ozone gas, or the higher the ozone gas partial pressure, or the higher the ozone concentration, the higher the oxidation speed. In particular, when a method of spraying ozone on a wafer is used, the oxidation speed is increased as the distance between the wafer and the spraying portion is shortened. In this embodiment, the oxidation speed increase is confirmed by setting the distance to 20 mm and 5 mm. Additionally, a tube of a material that does not absorb the lamp light is desirably used in the ozone gas inlet structure within a RTA chamber. Consequently, the tube for introducing ozone gas is not heated with lamp light. This makes it possible to suppress thermal decomposition of the ozone gas flowing through the inside of the tube. The present embodiment uses a tungsten/halogen lamp and a quartz tube for ozone gas introduction within the chamber. In addition, in this embodiment, ozone of a high concentration of 20% or more is prepared as below. A mixture gas of ozone of about 10% and oxygen is prepared by means of a general ozonizer, and then the resulting mixture is cooled. Subsequently, the oxygen alone is evacuated by making use of differences between oxygen and ozone in vapor pressure and adsorption property, thereby increasing the ozone concentration.

In addition, needless to say, use of the conventional oxidation furnace also can find the effectiveness of ozone oxidation although the efficiency is decreased.

The programming of data in this flowing gate type nonvolatile memory cell involves applying, for example, 0 V to the source region 206, applying an appropriate positive voltage to the drain region 207, and further applying an appropriate positive voltage to the control gate electrode 205 to implant the hot electrons generated in the channel into the flowing gate electrode 203. Read is carried out by detecting a value of drain current that passes through the source region and drain region. The erase operation involves applying an appropriate negative voltage to the control gate electrode 205 and applying an appropriate positive voltage to the substrate 201, and then extracting electrons accumulated in the floating gate electrode 203 into the substrate 201 by use of FN tunnel phenomena.

The electrical properties of the floating gate type nonvolatile memory fabricated in this embodiment were compared with those of the case via ISSG oxidation of the prior art. As a result, the read current and programming time were equivalent to the values of the conventional memory. However, the drop of the threshold voltage (Vth) in the initial period was suppressed as compared with that of the conventional memory. This suppressed the deterioration of the charge trapping properties over the conventional one.

Additionally, this embodiment has described a single gate structure; however, similar effects can be yielded in a floating gate type nonvolatile memory cell having a structure in which a nonvolatile memory MOS transistor and a MOS transistor adapted to select it are adjacent to each other, that is, a split gate structure.

In this embodiment, ozone of a high concentration is applied to the formation of the silicon oxide film on the silicon nitride film. However, even if high concentration ozone is applied to post oxidation subsequent to the aforementioned dry etching, increases in interface state density and trap density are suppressed as compared with the case of using ISSG oxidation.

In this embodiment, although ozone of high concentration is applied to the formation of the upper layer silicon oxide film 204c of the interlayer insulating film, similar effects can be obtained even in the case of applying the high concentration ozone to the formation of the lower layer silicon oxide film 204a.

This nonvolatile memory cell and a logic semiconductor device can also be consolidated on the same silicon substrate. In this case, even if the nonvolatile memory cell is fabricated subsequent to the formation of the logic semiconductor device, the deterioration of the gate insulating film of the logic semiconductor due to electrical stress is suppressed as compared with the case where conventional ISSG oxidation is applied to a nonvolatile memory cell.

The reference numerals used in the drawings of the invention stand for the following:

101 . . . Si substrate, 102 . . . gate insulating film, 103 . . . selective gate electrode, 104 . . . insulating film, 105 . . . insulating film, 105a . . . bottom silicon oxide film, 105b . . . silicon nitride film, 105c . . . top silicon oxide film, 106 . . . memory gate electrode, 107 . . . sidewall silicon oxide film, 108 . . . source region, 109 . . . drain region, 201 . . . Si substrate, 202 . . . tunneling silicon oxide film, 203 . . . floating gate electrode, 204 . . . insulating film, 204a . . . lower layer oxide film, 204b . . . silicon nitride film, 204c . . . upper layer silicon oxide film, 205 . . . gate electrode, 401 . . . Si substrate, 402 . . . insulating film, 402a . . . bottom silicon oxide film, 402b . . . silicon nitride film, 402c . . . top silicon oxide film, 403 . . . gate electrode, 404 . . . source region, 405 . . . drain region, 501 . . . Si substrate, 502 . . . gate insulating film, 503 . . . selective gate electrode, 504 . . . interlayer insulating film, 504a . . . bottom silicon oxide film, 504b . . . silicon nitride film, 504c . . . top silicon oxide film, 505 . . . memory gate electrode, 506 . . . source region, 507 . . . drain region, 800 . . . Si wafer surface, 801 . . . inlet area, 802 . . . gas flow rate, 803 . . . distance between ozone inlet and wafer.

What is claimed is:

1. A method of manufacturing a nonvolatile semiconductor memory device, comprising the steps of:

forming a gate insulating film on a semiconductor substrate;

forming a first gate electrode film on a top of the gate insulating film and forming an insulating film on a top of the first gate electrode film;

selectively patterning the gate insulating film, the first gate electrode film and the insulating film to form a first gate section;

forming a first insulating film on one side of the gate section and on the surface of the semiconductor substrate proximate the one side;

selectively patterning a stack film to form a second gate section, the stack film being fabricated by forming a silicon nitride film on a top of the first insulating film, oxidizing a surface portion of the silicon nitride film so as to form a second insulating film having a thickness of at least 4 nm, and further forming a second gate electrode film on a top of the second insulating film; and forming a first impurity introducing layer on one side of the first gate section within the semiconductor substrate and forming a second impurity introducing layer on one side of the second gate section, by selectively introducing impurities by use of the first gate section and the second gate section as masks for the impurity introduction, wherein the second insulating film is a film formed by oxidizing the surface of the silicon nitride film with radical oxygen in absence of hydrogen with a thermal process, wherein the radical oxygen is generated from ozone being 20% or more in concentration, and wherein arrival time of the ozone from an ozone inlet to an area above the substrate is shorter than time for thermal decomposition of the ozone.

2. A method of manufacturing a nonvolatile semiconductor memory device according to claim 1, wherein ozone oxidation using the ozone is carried out using a combination of process conditions satisfying $L/U < 2 \times 10^{-3}$ [s] where a distance from an ozone inlet to a wafer is set to L [m] and an ozone gas flow rate is set to U [m/s].

3. A method of manufacturing a nonvolatile semiconductor memory device according to claim 1, wherein the ozone is from 133 Pa to 20 kPa in partial pressure.

4. A method of manufacturing a nonvolatile semiconductor memory device according to claim 2, wherein the ozone is from 133 Pa to 1.33 kPa in partial pressure.

5. A method of manufacturing a nonvolatile semiconductor memory device according to claim 1, further comprising the step of forming a logic transistor on the semiconductor substrate.

6. A method of manufacturing a nonvolatile semiconductor memory device according to claim 1, further comprising the concentrated ozone gas formation steps of:
  preparing a mixture gas of ozone and oxygen;
  cooling the mixture gas; and
  evacuating only the oxygen so as to increase the ozone concentration of the mixture gas before supplying concentrated ozone gas to a gas line which leads the concentrated ozone gas to a process chamber.

7. A method of manufacturing a semiconductor memory device, comprising the steps of:
  forming a gate insulating film on a semiconductor substrate;
  forming a first gate electrode film on a top of the gate insulating film and
  forming a first insulating film on a top of the first gate electrode film;
  selectively patterning a stack film to form a gate section, the stack film being fabricated by forming a silicon nitride film on a top of the first insulating film, oxidizing a surface portion of the silicon nitride film so as to form a second insulating film having a thickness of at least 4 nm, and further forming a second gate electrode film on a top of the second insulating film; and
  forming a first impurity introducing layer on one side of the gate section within the semiconductor substrate and forming a second impurity introducing layer on the other side, by selectively introducing impurities by use of the gate section as a mask of the impurity introduction,
  wherein the second insulating film is a film formed by oxidizing the surface of the silicon nitride film with radical oxygen in absence of hydrogen with a thermal process, and
  wherein the radical oxygen is generated from ozone being 20% or more in concentration, and
  wherein arrival time of the ozone from an ozone inlet to an area above the substrate is shorter than time for thermal decomposition of the ozone.

8. A method of manufacturing a nonvolatile semiconductor memory device according to claim 7, wherein ozone oxidation using the ozone is carried out using a combination of process conditions satisfying $L/U < 2 \times 10^{-3}$ [s] where a distance from an ozone inlet to a wafer is set to L [m] and an ozone gas flow rate is set to U [m/s].

9. A method of manufacturing a nonvolatile semiconductor memory device according to claim 7, wherein the ozone is from 133 Pa to 20 kPa in partial pressure.

10. A method of manufacturing a nonvolatile semiconductor memory device according to claim 8, wherein the ozone is from 133 Pa to 1.33 kPa in partial pressure.

11. A method of manufacturing a nonvolatile semiconductor memory device according to claim 7, wherein the silicon nitride film and the second insulating film constitute a portion of an interlayer film present between the first gate electrode film and the second gate electrode film.

12. A method of manufacturing a nonvolatile semiconductor memory device according to claim 7, further comprising the step of forming a logic transistor on the semiconductor substrate.

13. A method of manufacturing a semiconductor memory device according to claim 6, further comprising the concentrated ozone gas formation steps of:
  preparing a mixture gas of ozone and oxygen;
  cooling the mixture gas; and
  evacuating the oxygen so as to increase the ozone concentration of the mixture gas before supplying concentrated ozone gas to a gas line which leads the concentrated ozone gas to a process chamber.

* * * * *